United States Patent
Aekins

(10) Patent No.: US 6,533,618 B1
(45) Date of Patent: Mar. 18, 2003

(54) BI-DIRECTIONAL BALANCE LOW NOISE COMMUNICATION INTERFACE

(75) Inventor: Robert A. Aekins, Branford, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 09/825,471

(22) Filed: Apr. 2, 2001

Related U.S. Application Data

(60) Provisional application No. 60/193,563, filed on Mar. 31, 2000.

(51) Int. Cl.⁷ .............................................. H01R 24/00
(52) U.S. Cl. ....................................... 439/676; 439/941
(58) Field of Search .................................. 439/676, 941

(56) References Cited

U.S. PATENT DOCUMENTS

| | | | |
|---|---|---|---|
| 2,714,194 A | 7/1955 | Beynink | 439/607 |
| 5,269,708 A | 12/1993 | DeYoung et al. | 439/676 |
| 5,299,956 A | 4/1994 | Brownell et al. | 439/638 |
| 5,310,363 A | 5/1994 | Brownell et al. | 439/676 |
| 5,326,284 A | 7/1994 | Bohbot et al. | 439/676 |
| 5,341,419 A | 8/1994 | Ferry | 379/417 |
| 5,362,257 A | 11/1994 | Neal et al. | 439/676 |
| 5,399,107 A | 3/1995 | Gentry et al. | 439/676 |
| 5,414,393 A | 5/1995 | Rose et al. | 333/1 |
| 5,432,484 A | 7/1995 | Klas et al. | 333/1 |
| 5,513,065 A | 4/1996 | Caveney et al. | 361/311 |
| 5,547,405 A | 8/1996 | Pinney et al. | 439/894 |
| 5,586,914 A | 12/1996 | Foster, Jr. et al. | 439/676 |
| 5,599,209 A | 2/1997 | Belopolsky | 439/676 |
| 5,618,185 A | 4/1997 | Aekins | 439/76.1 |
| 5,639,266 A | 6/1997 | Patel | 439/676 |
| 5,647,770 A | 7/1997 | Belopolsky | 439/676 |
| 5,674,093 A | 10/1997 | Vaden | 439/676 |
| 5,687,478 A | 11/1997 | Belopolsky | 29/884 |
| 5,697,817 A | 12/1997 | Bouchan et al. | 439/676 |
| 5,759,070 A | 6/1998 | Belopolsky | 439/676 |
| 5,779,503 A | 7/1998 | Tremblay et al. | 439/676 |
| 5,864,089 A | 1/1999 | Rainal | 174/35 C |
| 5,911,602 A | 6/1999 | Vaden | 439/676 |
| 5,913,702 A | 6/1999 | Garcin | 439/676 |
| 5,931,703 A | 8/1999 | Aekins | 439/676 |
| 6,023,200 A | * 2/2000 | Rhee | 333/1 |
| 6,089,923 A | 7/2000 | Phommachanh | 439/676 |
| 6,231,397 B1 | 5/2001 | de la Borbolla et al. | 439/676 |

* cited by examiner

*Primary Examiner*—Tulsidas Patel
(74) *Attorney, Agent, or Firm*—Cummings & Lockwood

(57) ABSTRACT

The present invention relates to RJ45 modular inserts that are connected to a printed circuit board used to transfer high speed signals for telecommunication interface media connections. The printed circuit board is configured to reduce near-end cross-talk ("NEXT") without compromising impedance. NEXT is substantially reduced by utilizing a low reactance dielectric insert with a two-stage combination positive and negative compensation removal technique. By utilizing this method, the pair-to-pair NEXT is substantially reduced and differential pair impedance are controlled in a simple and cost effective manner.

22 Claims, 8 Drawing Sheets

"Mated" NEXT

BI-DIRECTIONAL BALANCE LOW NOISE COMMUNICATION INTERFACE

RELATED APPLICATIONS

This application claims priority to U.S. Provisional Patent Application Serial No. 60/193,563, filed on Mar. 31, 2000, which is incorporated by reference herewith.

BACKGROUND

1. Technical Field

The present invention relates to a double balance electrical noise reduction device, RJ45 modular insert, and printed circuit board. The device is used for high frequency transfer of data signals to interface connectors for unshielded twisted pair media ("UTP"), and, more particularly, utilizes a low reactance modular insert with two stage positive and negative compensation techniques to produce low noise characteristics.

2. Background of the Disclosure

The wide acceptance of UTP for data and voice transmission is due to the large installed base, low cost, and ease of installation. Demands on networks using UTP systems such as 100 Mbit/s and 1000 Mbit/s transmission rates have increased, which has forced the development of industry standards requiring higher system bandwidth performance and lower noise-connecting hardware. What began as the need for connecting hardware to provide nearend cross-talk ("NEXT") loss of less than −36 dB at 16 MHz, has evolved to −54 dB at 100 MHz and −46 dB at 250 MHz for future category 6 systems. As the transmission rates have increased, so has system noise, in particular NEXT.

For any data transmission event, a received signal will consist of a transmission signal modified by various distortions. The distortions are added by the transmission system, along with additional unwanted signals that are inserted somewhere between transmission and reception. The unwanted signals are referred to as noise. Noise is the major limiting factor in the performance of today's communication systems. Problems that arise from noise include data errors, system malfunctions, and loss of the desired signals.

Generally, cross-talk noise occurs when a signal from one source is coupled to another line. Cross-talk noise could also be classified as electromagnetic interference ("EMI"). EMI occurs through the radiation of electromagnetic energy. Electromagnetic energy waves can be derived by Maxwell's wave equations. These equations are basically defined using two components: electric and magnetic fields. In unbounded free space a sinusoidal disturbance propagates as a transverse electromagnetic wave. This means that the electric field vectors are perpendicular to the magnetic field vectors that lie in a plane perpendicular to the direction of the wave. NEXT noise is the effect of near-field capacitive (electrostatic) and inductive (magnetic) coupling between source and victim electrical transmissions. NEXT increases the additive noise at the receiver and therefore degrades the signal-to-noise ratio ("SNR").

Cross-talk using a plug setup such as that illustrated in FIG. 1 will increase as the system speeds or system transmission frequencies increase. The transposition, or twisting of the transmitting wire pair, minimizes cross-talk generated in a cable. However, coupling occurs as the signal travels through untwisted sections such as plugs and plug contacts.

In a differential balance two wire per pair transmission system, the signals that travel along each wire (or other media) are equal in amplitude but opposite in phase. The phase difference of the two signals is ±n radians or voltage +1 (E1)=−voltage −1(E2) under ideal conditions. These signals at any instantaneous time couple electric and/or magnetic fields to adjacent lines, which reduces their SNR. The acceptable SNR depends on the type or quality of service that is required by the system. To remove the noise components, a forward signal equal but opposite to the original signal is induced. According to Fourier's wave theory and Maxwell's theory of electromagnetic fields, by coupling the opposite phase of the transmitted signal to a previously coupled adjacent line signal, the two signals cancel each other completely and therefore remove the noise from the adjacent line.

The ANSI/TIA/EIA 568A standard defines electrical performance for systems that utilize the 1–100 MHz frequency bandwidth range. Some data systems that utilize the 1–100 MHz frequency bandwidth range are IEEE Token Ring, Ethernet 10Base-T, and 100Base-T. The ANSI/TIA/EIA will soon finalize a standard defining electrical performance for systems that utilize the 1–250 MHz frequency bandwidth range for category 6 electrical performance. The increasing demand for more bandwidth and improved communication systems (e.g. Ethernet 1000Base-T) on UTP cabling will require improved connecting hardware.

The TIA/EIA category 6 draft-addendum for channel link defines the specified frequency bandwidth of 1–250 MHz, and a minimum NEXT value of −39.9 dB at 100 MHz and −33.1 dB at 250 MHz.

By increasing the bandwidth from 1–100 MHz (category 5) to 1–250 MHz (category 6), tighter controls of component noise susceptibility is necessary. With the development of the new standards, the new connecting hardware noise levels will have to be lower than the old connecting hardware that were used in category 5 media systems.

Methods for providing positive compensation to reduce cross-talk noise in connecting hardware is addressed in U.S. Pat. No. 5,618,185 to Aekins and U.S. Pat. No. 5,299,956 to Brownell et al., the contents of which are hereby incorporated by reference.

FCC part 68.500 provides standard mechanical dimensions to ensure compatibility and matability between modular plug housings of different manufacturers. Two basic modular plug housing types are produced based on the FCC part 68.500 standard. Type one is the standard FCC part 68.500 style for modular plug housings which does not add any compensation methods to reduce cross-talk noises. Type two is the standard FCC part 68.500 style for modular plug housings which add compensation methods to reduce cross-talk noises.

The type one modular plug housing provides a straight-forward approach by aligning connector contacts in an uniformed parallel pattern where high NEXT and far-end cross-talk ("FEXT") is produced. The standard FCC part 68.500 modular plug housing connectors defines two contact sections: a) section one is the matable area for electrical plug contact, and b) section two is the output area of the modular plug housing. Section one aligns the contacts in an uniformed parallel pattern from contact tip to the bend location that enters section two. Forming a contact in such a manner will produce high NEXT and FEXT noises. Section two also aligns the contacts in an uniformed parallel pattern from contact bend location to contact output, thus producing and allowing high NEXT and FEXT noises.

There have been attempts to reduce cross-talk noises in electrical connectors. For example, U.S. Pat. No. 5,674,093 to Vaden discloses a reduced cross-talk electrical connector including a housing that receives four pairs of elongated contacts for receiving electrical signals. One contact of each pair of contacts is irregularly bent into an "S" shape in order to reduce the parallelism between adjacent contacts. By reducing the parallelism between adjacent contacts, coupling effects between the contacts is reduced. Although cross-talk noise is reduced, the circuits return-loss and differential impedance is increased for all four pairs. In addition, it is difficult to form such irregularly shaped contacts.

The type two modular plug housing is the standard FCC part 68.500 style which add compensation methods to reduce cross-talk noises. An example of such a modular plug housing is disclosed in U.S. Pat. No. 5,639,266 to Patel. U.S. Pat. No. 5,639,266 provides a compensation approach for modular plug housings by aligning the contacts of the opposite pairs in an uniformed parallel pattern to removed cross-talk noises. The connector disclosed in U.S. Pat. No. 5,639,266 is defined by two contact section areas, section one is the matable area for electrical plug contact and section two is the output area of the modular plug housing. Section one aligns two contact positions, i.e., positions 3 and 5 out of 8, in an uniformed parallel pattern from contact tip to the bend location that enters section two, thus reducing cross-talk noises by signal compensation. Section two also aligns the contacts in an uniformed parallel pattern from contact bend location to contact stagger array output, which minimizes NEXT and FEXT noises.

From the above it is apparent that what is needed is an improved UTP connector that reduces connecting hardware cross-over talk NEXT noise. Importantly, the improved connector should not lessen the impedance characteristics of connected wire pairs. Furthermore, the improved connector should satisfy the new modular plug housing noise levels as provided in the new category 6 standard.

SUMMARY OF THE DISCLOSURE

The present invention relates to connecting hardware used in telecommunication systems. Its intention is to reduce cross-talk and therefore reduce the system's SNR. The invention also provides a connector that reduces cross-talk by utilizing a low reactance modular insert that is electrically connected to a printed circuit board ("PCB") which contains a positive and negative combination compensation technique without the need for shielding or any other physical components. In addition, the present invention provides a connector without cross-talk between the connector terminals that is inexpensive and simple to manufacture and use.

To achieve cross-talk reduction it is important to know where on the connecting interface hardware the major source of noise is being produced. The interface connecting point is a matable plug that forms an electrical connection to a modular plug housing that contains electrical current conducting contact terminals. The invention removes the coupled noise from adjacent lines that occur from interface connecting points.

FIG. 1 illustrates an RJ45 plug. It should be readily apparent that the worse case for a four-pair connector are pin positions 3, 4, 5, and 6. This is because both sides of the transmitting and receiving signal are adjacent to each other. This layout could be in any pin combination and would provide the same results. To remove cross-talk, forward and reverse electromagnetic field ("EMF") induced coupling methods are used.

At time equal to one (T=1), the forward method involves inducing an opposite signal, i.e., negative incident energy ("−IE 1"), from the incident transmission line to an adjacent victim transmission line whose positive noise ("+VE1"), or positive victim energy, originated from the positive signal of the incident transmission line. The forward method also involves inducing an opposite signal, i.e., a positive incident energy ("+IE1"), from the incident transmission line to an adjacent victim transmission line whose negative noise ("−VE1"), or negative victim energy, originated from the negative signal of the incident transmission line.

At time equal to one (T=1), the method involves inducing an opposite signal, i.e., negative incident energy ("−IE1"), from the incident transmission line to an adjacent victim transmission line whose negative noise ("−VE1"), or negative victim energy, originated from the negative signal of the incident transmission line.

When combined, the forward and reverse sections together produce a balanced signal energy output of the coupled victim line. The forward section provides enough signal energy to allow for half of its energy to be forward compensated and the other half is left over for the reverse section. The reverse section takes the forward signal energy and allows that signal energy to be coupled into the victim lines similar coupled energy polarity. The end result is a balanced output of the victim's noise energy that are canceled by each other due to their opposite coupling effects. The victim's signal energy that was induced by the incidents positive and negative signal energy is canceled by utilizing its self coupling of its opposing signal energies.

The reduction of cross-talk is basically obtained by a connector for a communication system consisting of a low reactance dielectric insert that is electrically connected to a PCB that consists of third, fourth, fifth and sixth RJ45 input terminals arranged in an ordered array. The third and fifth terminals as well as the fourth and sixth terminals are positively compensated, and the fifth and sixth, terminals as well as the third and fourth terminals are negatively compensated, all for the propose of electrically coupling each of the input terminals to the respective output terminals. By arranging the terminals in such a manner, canceling of induced cross-talk across the adjacent connector terminals is achieved.

The negative circuit includes first, second, third and fourth conductive paths between the respective input and output terminals. Each conductive path includes a plurality of conductive strips arranged with capacitive tuning stubs connected on one end of the input plug terminals to provide coupling between each conductive path. The first and third conductive paths capacitive tuning stubs are in relatively close proximity with each other to simulate capacitive coupling and contain twice the coupling energy as the second and fourth conductive paths capacitive tuning stubs.

The second and fourth conductive paths capacitive tuning stubs are in relatively close proximity with each other to simulate antenna transmission and receiving.

The reverse circuit means includes first, second, third and fourth conductive paths between the respective input and output terminals. Each conductive path includes a plurality of conductive strips arranged with capacitive tuning stubs connected on one end of the input plug terminals to provide coupling between each conductive path. The first and second conductive paths capacitive tuning stubs are in relatively close proximity with each other to simulate capacitive coupling stubs.

By utilizing the two-stage compensation method with the appropriate RJ45 modular housing, substantial cross-talk noise reduction is achieved up to 250 MHz. The end result is an inter-matable device that provides lower NEXT noises at higher frequencies than conventional one stage compensation inter-matable connecting hardware devises.

The present invention further controls and reduces the TIA/EIA electrical parameters such as powersum NEXT and provides a simpler path to differential impedance control by allowing non-separation of differential pairs.

By utilizing the two-stage compensation method with the appropriate RJ45 modular housing, substantial cross-talk noise reduction is achieved up to 250 MHz. The end result is an inter-matable device that provides lower NEXT noises at higher frequencies than conventional one stage compensation inter-matable connecting hardware devices.

Further aspects, implementations, and advantages of the present invention will become more readily apparent from the description of the drawings and the detailed description of the preferred embodiments of the invention as provided herein below.

BRIEF DESCRIPTION OF THE DRAWINGS

So that those having ordinary skill in the art to which the disclosed invention appertains will more readily understand how to make and use the same, reference may be made to the drawings wherein.

DETAILED DESCRIPTION OF THE PREFERRED EMBODIMENT(S)

Figure 1:
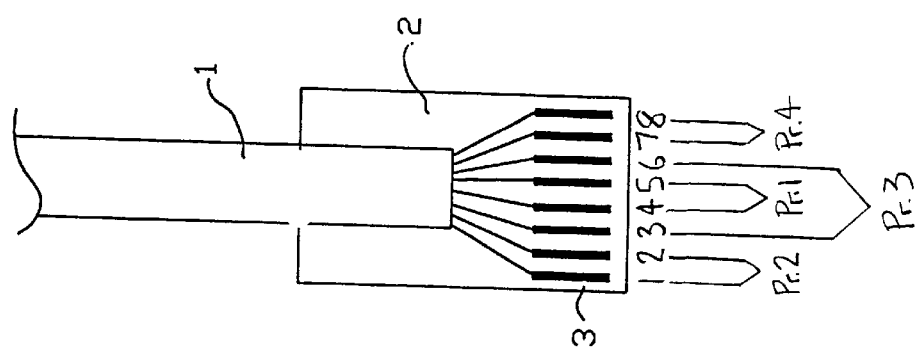
FIG. 1 is a schematic diagram of a communication plug and its input and output pin positions.

Reference is now made to the drawings, wherein like reference numerals identify similar components of the subject invention. TIA/EIA commercial building standards have recently defined category 6 electrical cross-talk performance parameters for a higher bandwidth (250 MHz) RJ45 plug. The TIA/EIA category 6 cross-talk or NEXT parameters is a lower reactance, capacitance and inductance, than category 5 rated RJ45 plug reactive NEXT values. As illustrated in FIG. 1, the EIA standard wiring formation for a T568B style RJ45 plug is presented. For a category 6 connecting hardware cabling system, the EIA RJ45 wiring style is the preferred formation that is followed throughout the cabling industry.

Referring to FIG. 1, there is illustrated a cable 1 including four UTPs connected to a plug 2 having eight contacts 3 positioned in accordance with a standard FCC part 68 RJ45 telecommunication plug. The eight contacts 3 are arranged in four pairs in accordance with T568B requirements. More particularly, pair 1 are attached to contact positions 4 and 5, pair 2 are attached to contact positions 1 and 2, pair 3 are attached to contact positions 3 and 6, and pair 4 are attached contact positions 7 and 8. The contact positions are used for tip (positive voltage) and ring (negative voltage) signal transmissions. For T568B category 6 frequencies, unwanted cross-talk is induced mainly between contact positions 3, 4, 5 and 6.

The present invention comprises interface-connecting hardware including a RJ45 modular jack, a printed circuit board ("PCB"), and an IDC terminal. The invention removes the coupled noise from RJ45 plug contact positions 3, 4, 5, and 6 that occur from the adjacency of the two pair arrangements. FIG. 1 illustrates that the worse case for a four pair RJ plug module is in the vicinity of pin positions 3, 4, 5 and 6, because both sides of the transmitting and receiving signals are adjacent to each other. In the four pair connecting hardware system there are multiple pairs for data signal transmission. The worse case NEXT noise that RJ45 plugs create is balanced coupled noise, that is, noise that is coupled equally upon adjacent pairs. For an EIA T568B RJ45 plug, the worse case noise is typically between pairs 1 and 3, that is, between contact positions 4 and 5 and contact positions 3 and 6, respectively.

The present invention comprises interface-connecting hardware including a RJ45 modular jack, a printed circuit board ("PCB"), and an insulation displacement contact ("IDC") terminal. The invention removes the coupled noise from RJ45 plug contact positions 3, 4, 5, and 6 that occur from the adjacency of the two pair arrangements. FIG. 1 illustrates that the worse case for a four pair RJ plug module is in the vicinity of pin positions 3, 4, 5 and 6, because both sides of the transmitting and receiving signals are adjacent to each other. In the four pair connecting hardware system there are multiple pairs for data signal transmission. The worse case NEXT noise that RJ45 plugs create is balanced coupled noise, that is, noise that is coupled equally upon adjacent pairs. For an EIA T568B RJ45 plug, the worse case noise is typically between pairs 1 and 3, that is, between contact positions 4 and 5 and contact positions 3 and 6, respectively.

PCB 4 may be divided into four sections. Section A is the contact layout for a conducting plug, which interfaces PCB 4 with, for example, the input/output plug illustrated in FIG. 1. Section A is designed not to induce any additional cross-talk into section B. Section B is the first stage electric circuitry. The circuit in section B provides the necessary circuitry for reducing forward cross-talk in the communication connector. In addition, section B also connects the current paths from section A to section C, but are not current carrying. Section C is the connecting point for the input/output UTP. This section usually follows the twisted pair wiring standards for tip and ring arrangements that is commonly used in an AT&T 110 IDC block. Section D is the second stage electric circuitry. The circuit in section D provides the necessary circuitry for reducing reverse crosstalk in the communication connector. In addition, section D also connects the current paths from section A to section C, but are not current carrying.

The input and output terminals are of conventional design that are used in telephone and other communication systems for such connectors such as jacks, patch panels and cross connects. The details of the preferred connector that may be used in input section A is describe herein below with reference to FIGS. 7–11. Output section C includes an insulation displacement contact terminal that is well know to those of ordinary skill in the art. Wire positions 4 and 5 (pair 1) are in communication with transmission lines 10 and 11, respectively, and wire positions 3 and 6 (pair 3) are in communication with transmission lines 9 and 12, respectively. The wire pair's 1 and 3 are the main transmission pairs of this invention. Transmission lines 10 and 11 (pair 1) become trace wires 22 and 23, respectively, after the circuitry in section B. Transmission lines 9 and 12 (pair 3) become trace wires 21 and 24, respectively, after the circuitry in section B. Upon entering section C, trace wires 22 and 23 (pair 1) are connected to output IDC terminals 14 and 13, respectively. Upon entering section C, trace wires 21 and 24 (pair 3) are connected to output IDC terminals 17 and 18, respectively.

Figure 3:
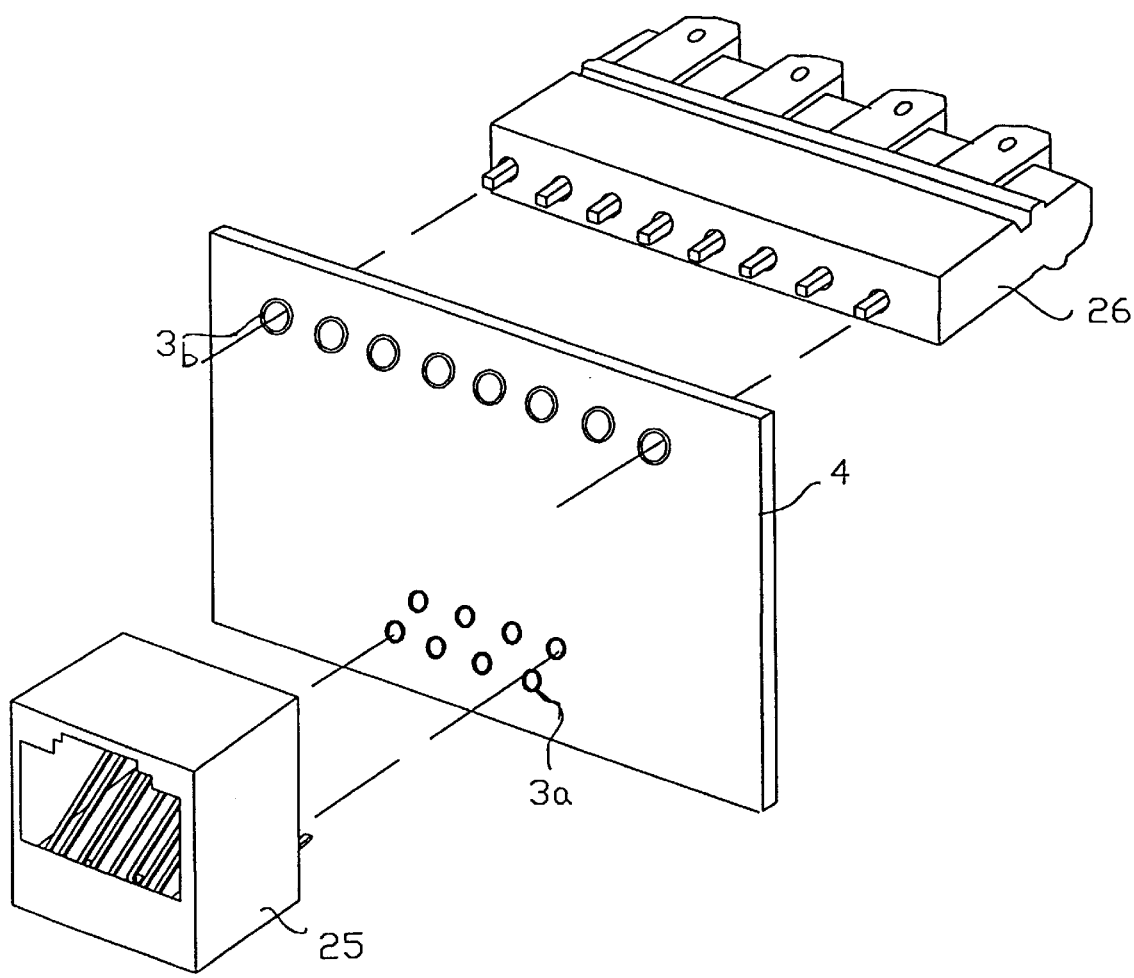
FIG. 3 is an exploded perspective view of an embodiment of the present invention including a four-pair RJ modular housing, a printed circuit board, and an eight-wire insulation displacement contact.

Referring to FIG. 3, an exploded perspective view of an embodiment of the present invention is illustrated. Modular housing 25 is bidirectional and may receive input signals from an RJ45 specification plug as illustrated in FIG. 1. PBC 4 provides an electrical connection between the terminals of a modular housing 25 and the terminals of an IDC terminal 26 by utilizing an array of conductive plated-through holes 3a and 3b.

Figure 2:
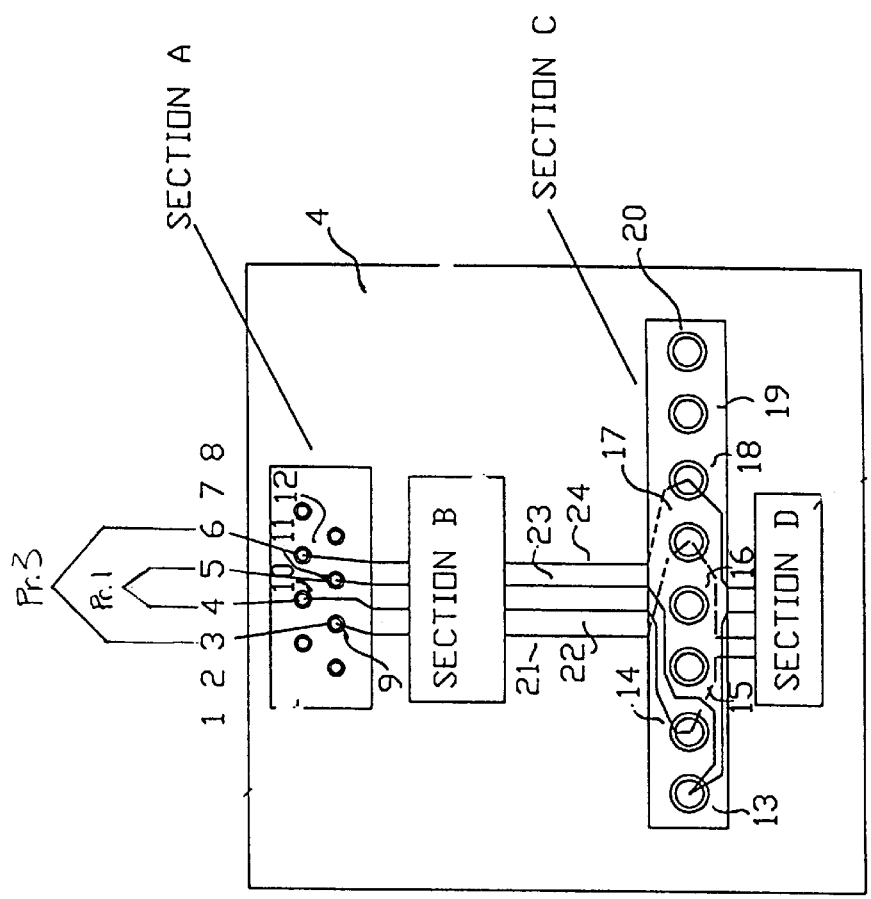
FIG. 2 is a schematic diagram of a printed circuit board made in accordance with an embodiment of the present invention.
Figure 4:
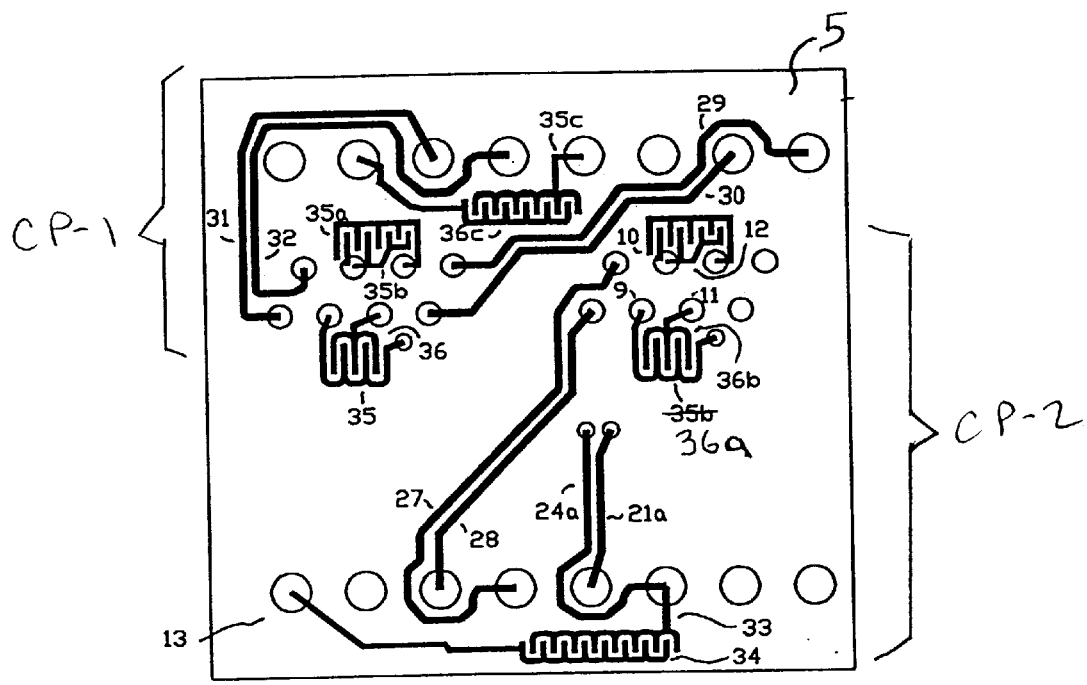
FIG. 4 is a top plan view of a printed circuit board used in an embodiment of the present invention.
Figure 5:
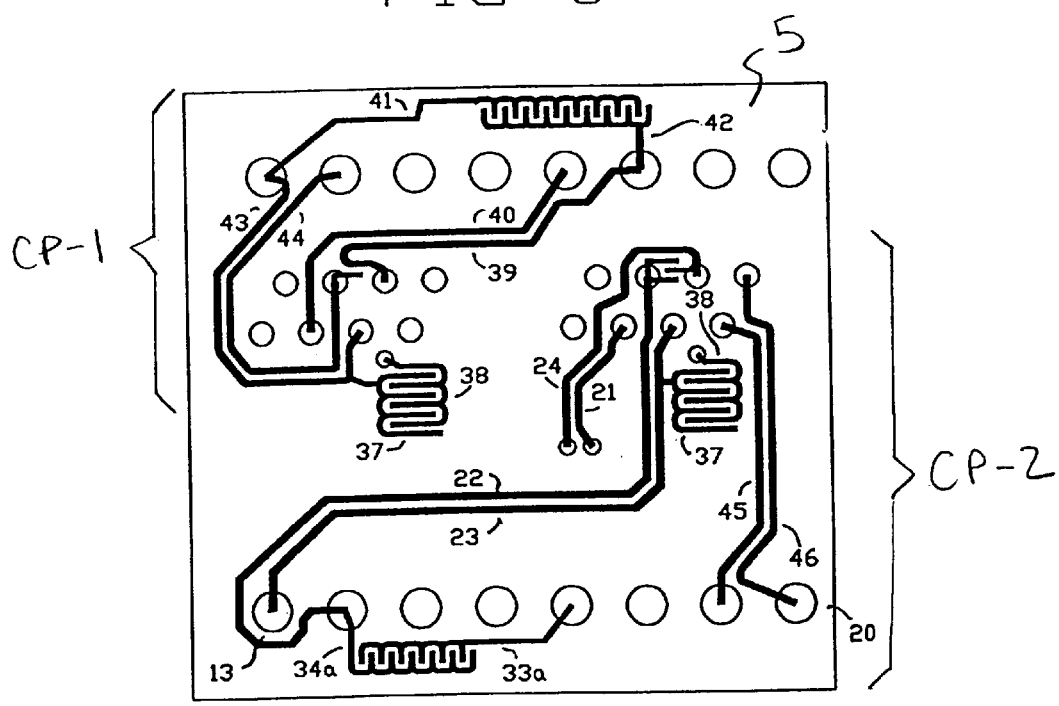
FIG. 5 is a mirror image of the bottom plan view of the printed circuit board illustrated in FIG. 4.

Referring to FIGS. 4 and 5, there is illustrated a top plan view of a PCB 5, and a mirror image of the bottom plan view of PCB 5, respectively. Sections B and D from FIG. 2 are included as certain printed circuits (described below) on PCB 5. It is notable that PCB 5 is a two port, two sided printed circuit board having eight conductive paths for each communication port. Communication port 1 ("CP-1") has conductive traces 31, 32, 29, 30, 43, 44, 40, and 39 and communication port 2 ("CP-2") has conductive traces 27, 28, 21, 24, 22, 23, 45, and 46.

As noted above, the two pairs of interest are pairs 1 and 3 of both ports. CP-1, pair 1 includes conductive paths that are differential driven trace pairs 43 and 44. CP-1, pair 3 includes conductive paths that are differential driven trace pairs 39 and 40. CP-2, pair 1 includes conductive paths that are differential driven trace pairs 22 and 23. And CP-2, pair 3 includes conductive paths that are differential driven trace pairs 21 and 24, which are electrically connected to trace pairs 21a and 24a respectively.

For CP-1, the conductive traces 44 and 39 are electrically connected to a positive compensation network trace 35a and 35b and conductive traces 43 and 40 are electrically connected to a forward compensation network trace 35 and 36. For CP-2, the conductive traces 22 and 24 are electrically connected to a forward compensation network trace 10 and 12 and conductive traces 21 and 23 are electrically connected to the positive compensation network trace 36a and 36b.

The positive compensation traces for CP-1 (i.e., 35a, 35b, 35 and 36) are of the same thickness. The positive compensation traces for CP-2 (i.e., 10, 12, and 36a, 36b) are also of the same thickness. The unity of length and thickness is useful for peak field coupling. The separation distances of the traces are approximately equal for each conductive path.

The CP-1 transmission traces 31 and 32 (pair 2) electrically connect a modular insert to IDC output terminals as shown. The CP-1 transmission traces 29 and 30 (pair 4) electrically connect the modular insert to the IDC output terminals as shown. The CP-2 transmission traces 27 and 28 (pair 2) electrically connect a modular insert to IDC output terminals as shown. The CP-2 transmission traces 45 and 46 (pair 4) electrically connect the modular insert to the IDC output terminals as shown.

The section B positive compensation circuitry 35a and 35b provide opposite induced signal energy to/from the CP-1 input signal modular insert for ring polarity of pairs 1 and 3. The section B positive compensation circuitry 35 and 36 provide opposite induced signal energy to/from the CP-1 input signal modular insert for tip polarity of pairs 1 and 3. Negative cross-talk noise that is induced by plug contacts 3 (FIG. 1) is partially removed by section B positive compensation circuitry 35, 36, 35a, 35b. The positive compensation circuitry path 35a and 35b, and 35 and 36 are transceivers to each other. That is, each conductive trace path has the capability to transmit and receive a signal. For optimal transceiver coupling the trace pairs 35a, 36a and 35, 36 are set within close proximity to each other to enhance positive static coupling.

In section D, the re-injected double negative compensation circuitry 41,42 and 35c, 36c provide like induced signal energy to/from the input signal modular insert for ring polatrity of pairs 1 and 3. In section C, the re-injected compensation circuitry 33, 34 and 34a, 33a provide like induced signal energy to the input signal modular insert for tip polarity of pairs 1 and 3. The negative cross-talk noise that is induced by the plug contacts 3 (FIG. 1) is removed by section B positive compensation circuitry 35, 36 and 35a, 35b and section D reinjected negative compensation circuitry 33, 34, 33a, 34a, 35c, 36c, and 41, 42. The negative compensation circuitry paths 41 and 42 as well as 33 and 34 are transceivers to each other. Also, the negative compensation circuitry paths 35c and 36c as well as 34a and 33a are transceivers to each other. For optimal transceiver coupling the trace pairs 41 to 42, 33 to 34, 33a to 34a and 35c to 36c are set within close proximity to each other for enhance negative static coupling.

For CP-1, section D, the re-injected double negative compensation circuitry 41,42 and 35c, 36c provide like induced signal energy to/from the input signal modular insert for ring polarity of pairs 1 and 3. For CP-2, section D, the re-injected compensation circuitry 33, 34 and 34a, 33a provide like induced signal energy to the input signal modular insert for ring polarity of pairs 1 and 3. The negative cross-talk noise that is induced by the plug contacts 3 (FIG. 1) is removed by section B positive compensation circuitry 35, 36, 35a, 35b in CP-1 and 10, 12, 36a, 36b in CP-2. and section D re-injected negative compensation circuitry 33, 34, 33a, 34a in CP-2, and 35c, 36c, 41, 42 in CP-1. The negative compensation circuitry paths 41 and 42 as well as 33 and 34 are transceivers to each other. Also, the negative compensation circuitry paths 35c and 36c as well as 34a and 33a are transceivers to each other. For optimal transceiver coupling the trace pairs 41 to 42, 33 to 34, 33a to 34a and 35c to 36c are set within close proximity to each other for enhance negative static coupling.

The circuit bridge also contains negative and positive mutual capacitance's that are obtained from the RJ45 plug wires and contact interactions.

The present invention will reduce victim lines induced cross-talk noise that is received from incident (source) lines by providing a balanced output across the output terminals. The present invention is concerned primarily with the input RJ45 pairs 1 and 3, i.e., positions 4,5 and 3,6, respectively. If the signal source is at pair 1 (positions 4 and 5) then the victim lines will be predominately pair 3 (positions 3 and 6) in accordance with the connector illustrated in FIG. 1.

The capacitance symbols from a balanced bridge are as follows, negatives (−C43 equals plug mutual capacitance of positions 4 to 3), (−C56 equals plug mutual capacitance of positions 5 to 6), and (−C56a equals PCB mutual capacitance of positions 5 to 6). The capacitance symbols from a balanced bridge are as following, positive (−C46 equals plug mutual capacitance of positions 4 to 6), (−C46a equals PCB mutual capacitance of positions 4 to 6), and (−C53 equals PCB mutual capacitance of positions 5 to 3). Providing that the interfacing plugs positive mutual capacitance equals the PCB negative mutual capacitance to complete the balanced circuit.

The circuit balance between source and victim will be as shown: $|-C_{43}|/|-C_{56a}-C_{56b}|_{source}=|C_{46a}+C_{46b}|/|C_{53}|_{victim}$. If certain assumptions and theoretical percentages of the invention for source and victim line mutual capacitance's are introduced, the formula evolves into $|-\frac{1}{2}C_{43}|/|-\frac{1}{2}C_{56}-C_{56}|_{neg}=|\frac{1}{2}C_{46}+\frac{3}{4}C_{46}|/|\frac{3}{4}C_{53}|_{pos}$. $|-\frac{1}{2}C_{43}|/|-1^{1/2}C_{56}|_{neg}=1\frac{1}{4}C_{46}|/|\frac{3}{4}C_{53}|_{pos}$, solving at like bridge terminals, $(-\frac{1}{2}C_{43}+\frac{3}{4}C_{53}/-1^{1/2}C_{56}+1\frac{1}{4}C_{46})_{Vneg-pos}=(\frac{1}{4}C_{3}/-\frac{1}{4}C_{6})_{Vresultant\ victim}$ The balance $V_{resultant}$(victim line) secondarily couples its voltage energy $(-\frac{1}{4}C_{3}/-\frac{1}{4}C_{6})_{Vresultant\ victim}$ to produce a balance ultra low noise output of $C_{36}$ pair 3. The double balance method helps in controlling the circuit transmission impedance. Maintaining the relative parallel adjacency along a significant distance along its current carrying path controls the line impedance. The impedance can be estimated using the differential line impedance equation shown below. $Z_{char}=120/SQRT(e_r/2)*[Ln(s/d+SQRT(s/d)^2-1)]$, where "s" is the trace spacing, "d" is the line area and "$e_r$" is the dielectric media of transmission.

Figure 6:
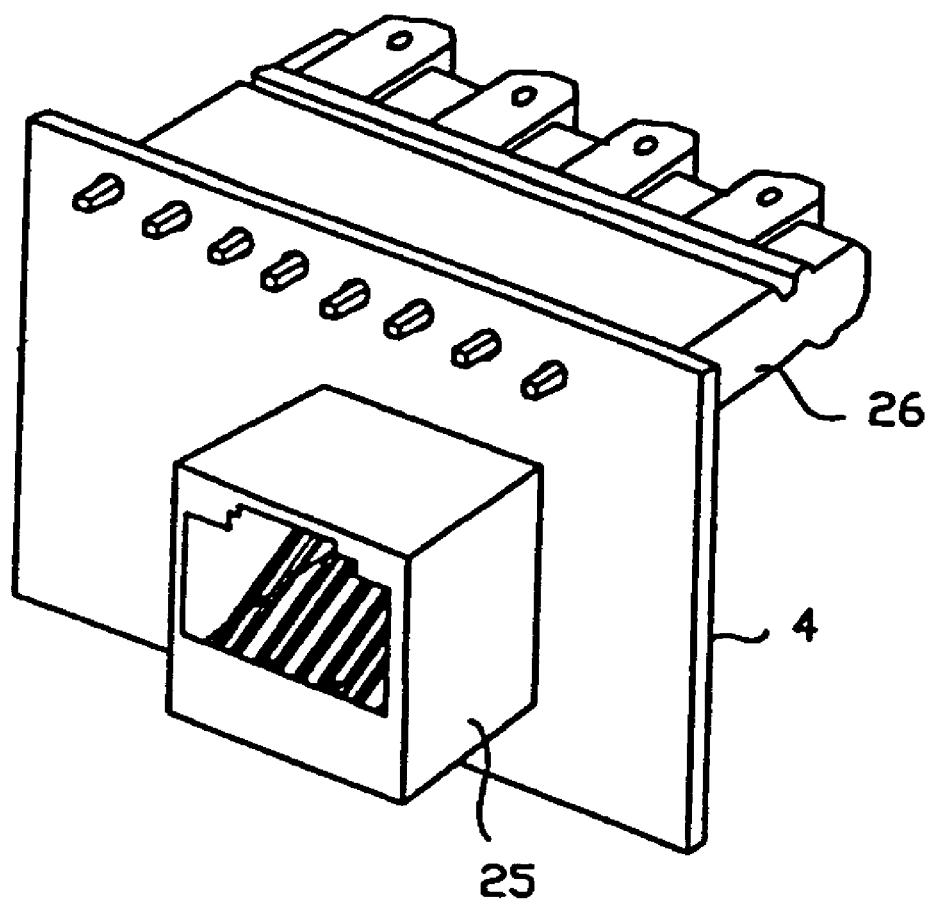
FIG. 6 is a perspective view similar to FIG. 3, though, after the components have been assembled.

Referring to FIG. 6, there is a perspective view similar to FIG. 3 wherein a connector assembly is shown to include a printed circuit board 4 that is electrically connected to modular housing 25 and IDC terminal 26. In the embodiment shown, a low reactance modular housing 25 is required to complete the combination balanced input. Utilizing a low reactance modular housing with the internal circuitry of PCB 4, the input negative noises that are created by an RJ45 plug inserted in modular housing 25 is significantly reduced.

Figure 7:
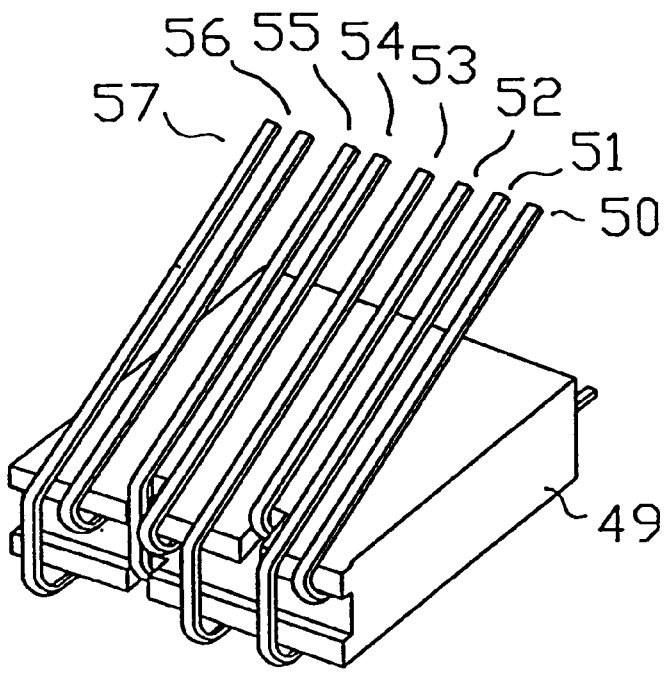
FIG. 7 is a perspective view of a contact insert holder for electrically connecting an RJ45 plug to a printed circuit board.
Figure 8:
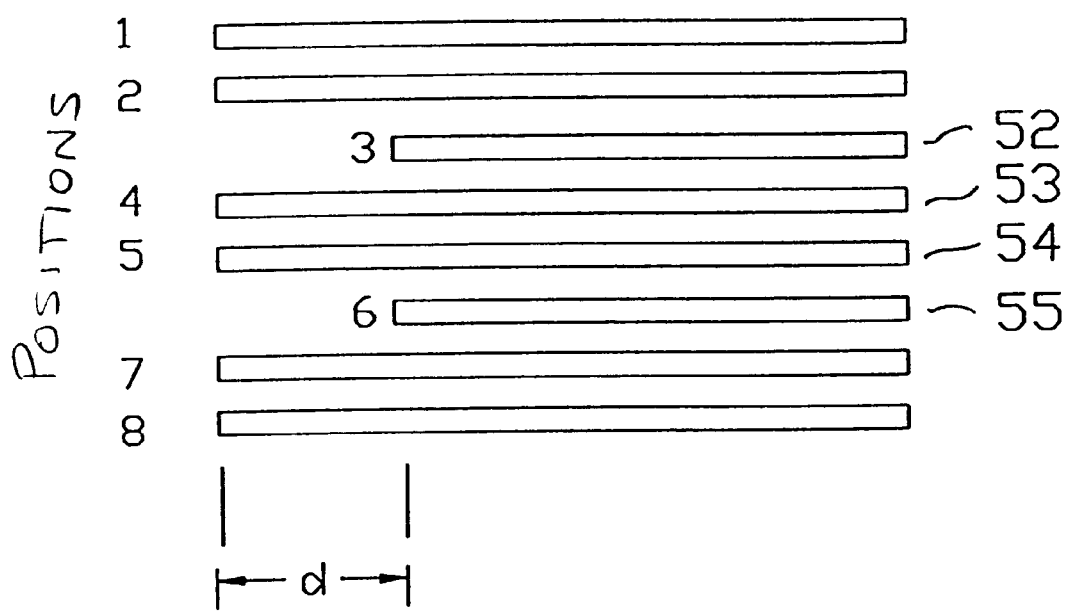
FIG. 8 is a bottom view of the contact insert holder illustrated in FIG. 7.

Referring to FIGS. 7 and 8, there is illustrated a perspective view of a contact insert holder 49 for electrically connecting the RJ45 modular housing 25 (FIG. 6) to PCB 4. The contacts in insert holder 49 are arranged in such negative mutual coupling is reduced in positions 3, 4, 5 and 6 (FIG. 1) when compared to standard RJ45 modular inserts, which typically remain parallel and adjacent until the contacts are in their bent position. The contacts of particular interest herein are contacts 53 and 54 (pair 1) and contacts 52 and 55 (pair 3).

The contact insert holder 49 typically contains four pairs of contacts including contacts 50, 51, 52, 53, 54, 55, 56, 57, and 58 as shown. The modular housing 25 and contact insert holder 49 are configured to accept standard FCC part 68 style plugs. For the EIA T568B or T568A style connectors of category 5 and 6 UTP cabling, there are eight contact positions. The eight contact positions are as follows: 50 and 51 (pair 2), 52 and 55 (pair 3), 53 and 54 (pair 1), and 56 and 57 (pair 4). Of the eight contacts, positions 52 and 55 are shifted inwards a distance "d" into the contact insert holder 49 away from the other six contacts as shown in FIG. 8.

Figure 9:
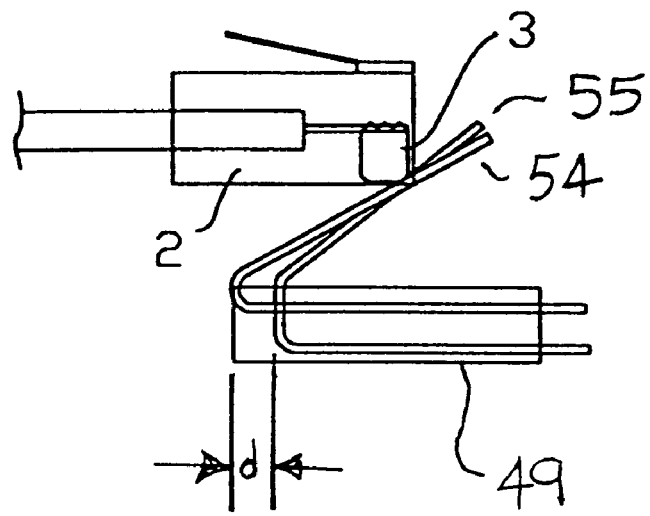
FIG. 9 is a side elevation view illustrating the mating of an RJ45 plug with the contact insert holder illustrated in FIGS. 7 and 8.
Figure 10:
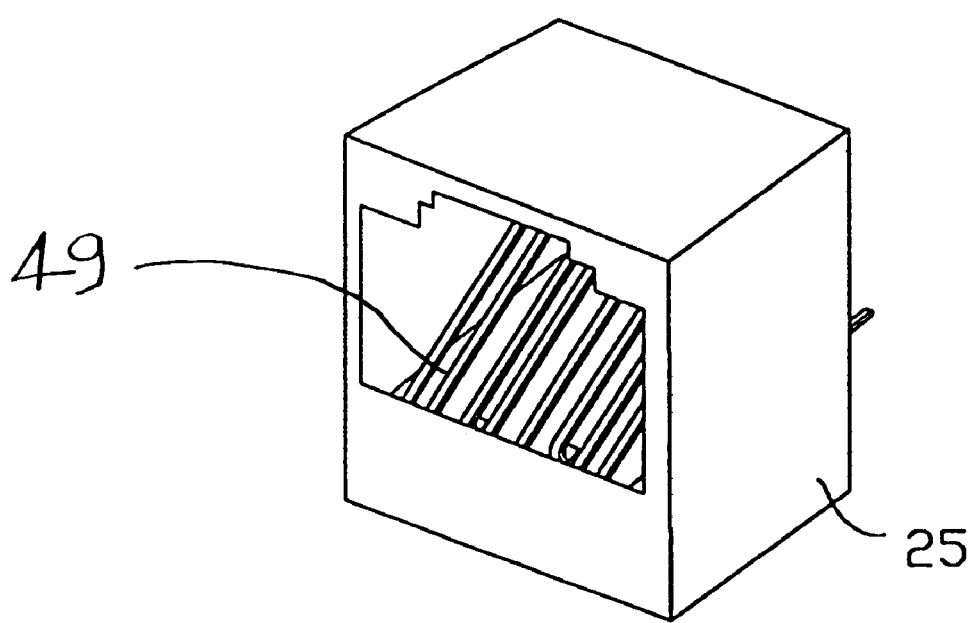
FIG. 10 is a perspective view of the contact insert holder that is illustrated in FIG. 7 assembled to an RJ45 modular housing.
Figure 11:
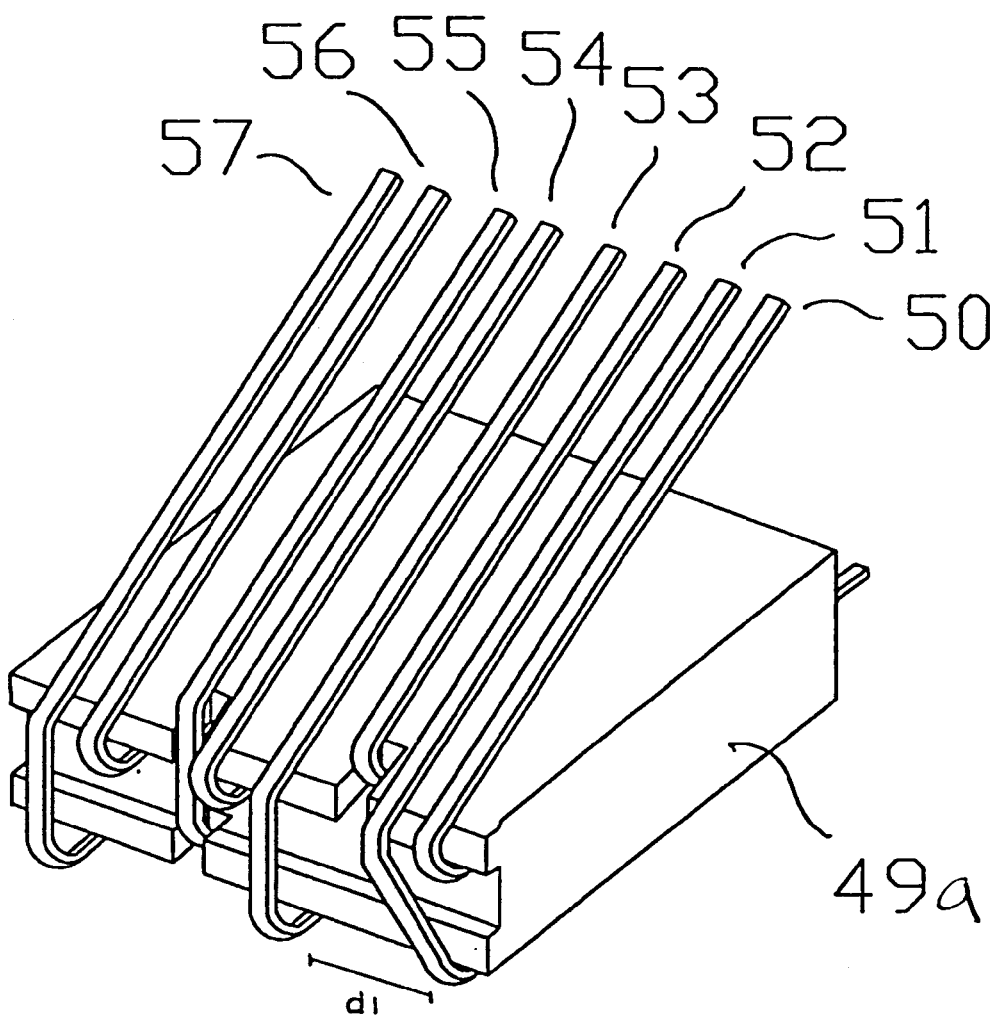
FIG. 11 is a perspective view of a contact insert holder that is similar to the contact insert holder illustrated in FIG. 7, however, it includes a modified contact 51.

Referring to FIG. 9, by shifting contacts 52 and 55 the proper distance away from the other six contact positions, the parallelism between the eight contacts is eliminated in the contact insert holder 49, which is one major factor that increases cross-talk reactance coupled noises. When an FCC regulated part 68 plug 2 is fully mated with the contact insert holder 49, contacts 52 and 55 form an estimated angle of 40 degrees with respect to the body of the contact insert holder 49 and the remaining six contacts (i.e., 50, 51, 53, 54, 56, and 57) form an estimated angle of 30 degrees. FIG. 11 shows the low reactance dielectric contact insert holder 49 assembled to a standard RJ45 modular housing 25. This assembly may be assembled to section A of PCB 4 (FIG. 2.)

Figure 12:
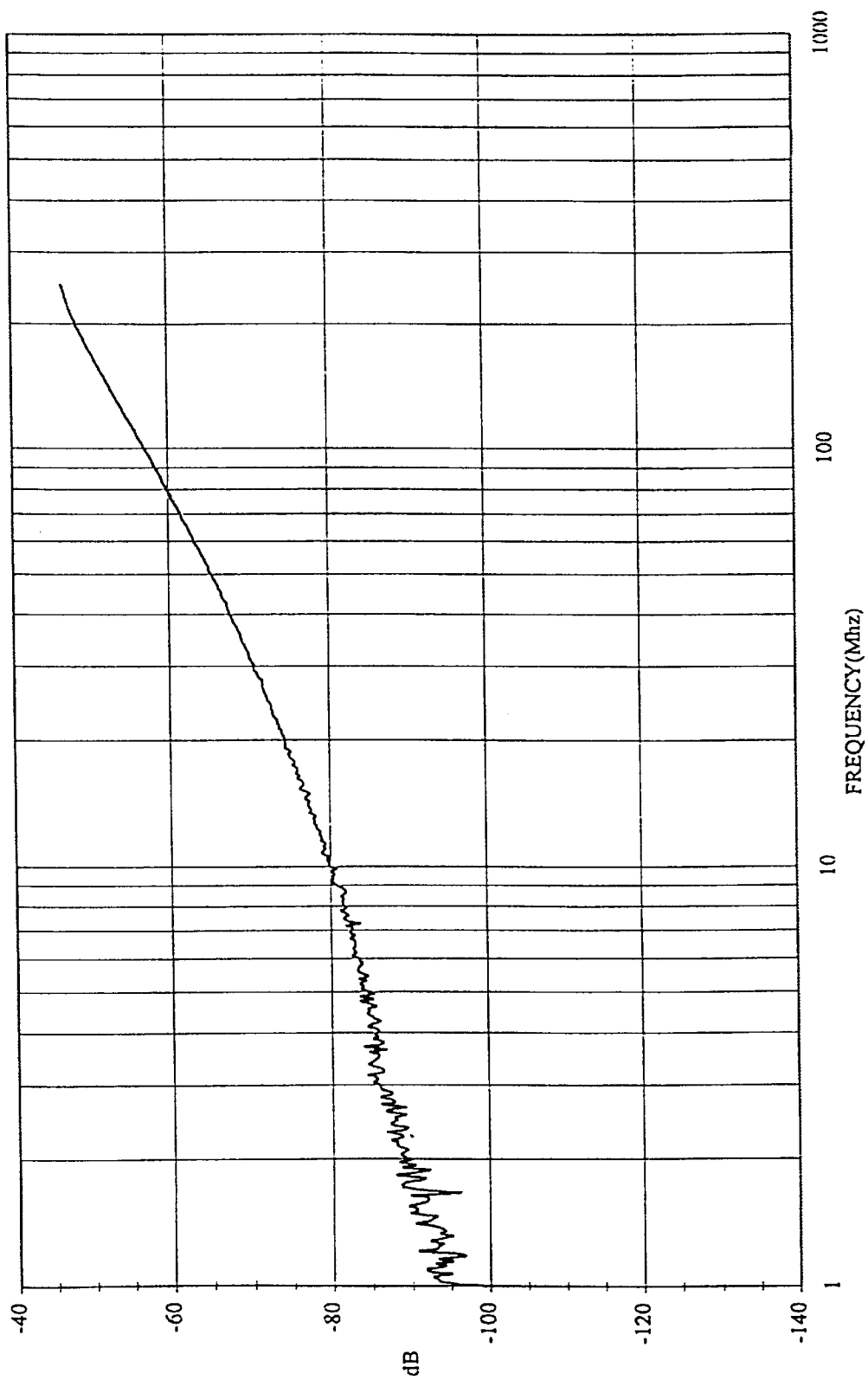
FIG. 12 is a graph illustrating improved NEXT noise data from an embodiment of the present invention as measured per EIA category 6 standard test methods.

Referring to FIG. 11, there is illustrated an alternate embodiment contact insert holder 49a. In the alternate embodiment, the bottom location of contact 51 is shifted a distance "d1" away from contact 53. This alteration further improves and lowers the reactance noises that are created by an RJ45 plug. FIG. 12 illustrates the improved NEXT noise data from an embodiment of the present invention as measured per EIA category 6 standard test methods.

By forming a contact insert holder as described above, cross-talk noise is countered without requiring new equipment or expensive re-wiring. Furthermore, by utilizing the combination of the appropriately placed positive and negative reactance circuitry and a low reactance dielectric contact insert holder as described above, victim cross-talk noise is eliminated. More particularly, by using the low reactance dielectric insert and the double reactance technique, the amount of unwanted signals can be adjusted to cancel that which was injected by a plug input, thus increasing the system's SNR.

While the present disclosure includes a description of the invention with reference to various specific embodiments, those skilled in the art will readily appreciate that various modifications, changes and enhancements may be made thereto without departing from the spirit or scope of the invention as defined by the appended claims.

What is claimed is:

1. A device for reducing electrical noise during the transfer of data from media having a plurality of electrically conductive signal elements, wherein inductive coupling occurs in adjacent conductive signal elements, said device comprising:

(a) a dielectric support member having two opposing sides;

(b) a first data communication port disposed on the support member for interfacing with a first media;

(c) a second data communication port disposed on the support member for interfacing with a second media;

(d) a plurality of conductive members disposed on the support member for providing communication between the first and the second communication ports, wherein each conductive member of the plurality of conductive members is associated with only one signal element of the plurality of signal elements;

(e) at least one first plurality of conductive strips disposed on a side of the support member and in communication with a first conductive member of the plurality of conductive members;

(f) at least one second plurality of conductive strips disposed on a side of the support member and in communication with a second conductive member of the plurality of conductive members; and wherein the first and the second pluralities of conductive strips have a positional relationship such that a capacitance for compensating inductive coupling is formed.

2. A device as in claim 1, wherein the first and the second conductive members are associated with adjacent signal members.

3. A device as in claim 1, further comprising:
   (g) at least one third plurality of conductive strips in communication with a third conductive member of the plurality of conductive members;
   (h) at least one fourth plurality of conductive strips in communication with a third conductive member of the plurality of conductive members; and
   wherein the third and the fourth pluralities of conductive strips have a positional relationship such that a capacitance for compensating the potential inductive coupling is formed.

4. A device as in claim 3, wherein the first and the second pluralities of conductive strips compensate for positive inductive coupling and the third and the fourth pluralities of conductive strips compensate for negative inductive coupling.

5. A device as in claim 4, wherein the first and the second conductive strips are disposed on the support member within sufficient proximity whereby the first and the second conductive strips are transceivers with respect to each other, and
   wherein the third and the fourth conductive strips are disposed on the support member within sufficient proximity whereby the third and the fourth conductive strips are transceivers with respect to each other.

6. A device as in claim 1, wherein the first data communication port is configured to interface with a standard RJ45 telecommunication plug.

7. A device as in claim 1, wherein the second data communication port is an insulation displacement contact terminal.

8. A device as in claim 1, wherein the first and the second conductive strips are disposed on the support member within sufficient proximity whereby the first and the second conductive strips are transceivers with respect to each other.

9. A device for removing electrical noise in standard RJ45 terminal plugs having four pairs of conductive signal elements one through eight wherein signal elements three through six are adjacent each other, comprising:
   (a) a dielectric substrate;
   (b) at least one data communication port disposed on the substrate for interfacing with an RJ45 telecommunication plug;
   (c) at least one insulation displacement contact terminal disposed on the substrate for interfacing with twisted pair cable;
   (d) at least one set of eight conductive traces on the substrate in communication with the communication port and the insulation displacement contact terminal, wherein one set of one through eight of the eight conductive traces are operatively associated with one through eight of the eight signal elements, respectively;
   (e) a portion of the traces three through six each including a plurality of conductive strips having a positional relationship such that a balance voltage bridge of mutual capacitor reactance for compensating the electrical noise is formed.

10. A device as in claim 9, wherein said substrate is a printed circuit board.

11. A device as in claim 9, wherein said portion comprises a plurality of conductive strips in communication with the traces.

12. A device as in claim 9, wherein said portion comprises:
   (e) a section of trace three being adjacent a section of trace five;
   (f) a section of trace six being adjacent a section of trace five;
   (g) a section of trace three being adjacent a section of trace four; and
   (h) a section of trace six being adjacent a section of trace four.

13. A device as in claim 12, wherein the adjacent sections comprise a plurality of conductive strips.

14. A device as in claim 9, wherein the eight traces have substantially the same thickness.

15. A device as in claim 9, wherein the positional relationship of the traces with respect to each other is substantially the same for all the traces.

16. A printed circuit board assembly for removing electrical noise during the transfer of data from media having a plurality of electrically conductive signal elements, wherein inductive coupling occurs among pairs of adjacent signal elements of the plurality of signal elements, the printed circuit board assembly comprising,
   (a) at least one first low reactance dielectric port disposed on the assembly for interfacing with the media;
   (b) at least one second low reactance dielectric port disposed on the assembly for interfacing with the media;
   (c) a plurality of conductive traces in communication with the first and the second ports, wherein each trace of the plurality of traces is associated with one signal element;
   (d) at least one first compensation circuit including a plurality of conductive strips for at least one pair of the traces associated with the adjacent signal elements for providing opposite induced signal energy; and
   (e) at least one second compensation circuit including a plurality of conductive strips for at least one pair of the traces associated with the pairs of adjacent signal elements for providing like induced signal energy.

17. An assembly as in claim 16, wherein the first compensation circuit provides positive voltage and the second compensation circuit provides negative voltage.

18. An assembly as in claim 16, wherein there are two first compensation circuits and one second compensation circuit.

19. An assembly as in claim 16, wherein the first port is configured to receive a RJ45 telecommunication plug.

20. An assembly as in claim 16, wherein the compensation circuits comprise a plurality of conductive strips in communication with the traces associated with the adjacent signal elements.

21. An assembly as in claim 20, wherein the plurality of conductive strips further comprise conductive tuning stubs.

22. A device for removing electrical noise during the transfer of data signals between media having a plurality of electrically conductive signal elements, the device comprising:
   (a) a dielectric support member;
   (b) a plurality of first and second communication ports, wherein each first and second communication port interfaces with one of the media;
   (c) a plurality of conductive members providing communication between each first and second data communication port of the plurality of first and second communication ports, wherein each conductive member of the plurality of conductive members is associated with only one signal element of the plurality of electrically conductive signal elements;

(d) at least one first plurality of conductive strips in communication with a first conductive member of the plurality of conductive members;

(e) at least one second plurality of conductive strips in communication with a second conductive member of the plurality of conductive members; and wherein the first and the second pluralities of conductive strips have a positional relationship such that a capacitance is formed for compensating the electrical noise.

* * * * *